(12) United States Patent
Jung et al.

(10) Patent No.: US 7,928,002 B2
(45) Date of Patent: Apr. 19, 2011

(54) METHOD OF FORMING WIRING LAYER OF SEMICONDUCTOR DEVICE

(75) Inventors: Mu-kyeng Jung, Suwon-si (KR); Sun-jung Lee, Seoul (KR); Ki-chul Park, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 11 days.

(21) Appl. No.: 12/396,632

(22) Filed: Mar. 3, 2009

(65) Prior Publication Data

US 2009/0227101 A1 Sep. 10, 2009

(30) Foreign Application Priority Data

Mar. 5, 2008 (KR) .................. 10-2008-0020582

(51) Int. Cl.
*H01L 21/4763* (2006.01)
(52) U.S. Cl. ......................................................... 438/622
(58) Field of Classification Search .................. None
See application file for complete search history.

(56) References Cited

U.S. PATENT DOCUMENTS

| | | | | |
|---|---|---|---|---|
| 5,973,348 A | * | 10/1999 | Ishibashi | 257/306 |
| 6,153,510 A | * | 11/2000 | Ishibashi | 438/622 |
| 6,486,557 B1 | | 11/2002 | Davis et al. | |
| 7,696,555 B2 | * | 4/2010 | Ema | 257/314 |
| 2004/0173836 A1 | * | 9/2004 | Oh et al. | 257/303 |

FOREIGN PATENT DOCUMENTS

| | | |
|---|---|---|
| JP | 2000-077410 | 3/2000 |
| JP | 2001-284454 | 10/2001 |
| KR | 1020000023165 | 4/2000 |
| KR | 1020000059383 | 10/2000 |

* cited by examiner

*Primary Examiner* — Charles D Garber
*Assistant Examiner* — Andre' C Stevenson
(74) *Attorney, Agent, or Firm* — F. Chau & Associates, LLC

(57) ABSTRACT

A method of forming a wiring layer of a semiconductor device, includes forming a first interlayer insulating layer to have a first thickness corresponding to a part of the thickness of an interlayer insulating layer that is to be formed on a support layer and forming a first contact plug in the first interlayer insulating layer. The method further includes forming a second interlayer insulating layer to have a second thickness on the first contact plug and the first interlayer insulating layer, thereby forming the interlayer insulating layer, wherein the second thickness corresponds to the rest of the thickness of the interlayer insulating layer, and forming a second contact plug connected to the first contact plug in the second interlayer insulating layer, thereby forming a local wiring layer including the first contact plug and the second contact plug.

20 Claims, 8 Drawing Sheets

METHOD OF FORMING WIRING LAYER OF SEMICONDUCTOR DEVICE

CROSS-REFERENCE TO RELATED PATENT APPLICATION

This application claims priority to Korean Patent Application No. 10-2008-0020582, filed on Mar. 5, 2008, the disclosure of which is hereby incorporated by reference herein in its entirety.

BACKGROUND OF THE INVENTION

1. Technical Field

The present disclosure relates to a method of forming a semiconductor device, and more particularly, to a method of forming a wiring layer of a semiconductor device.

2. Description of the Related Art

As the integration density of semiconductor devices has increased, the size of patterns constituting the semiconductor devices has been gradually reduced. In particular, the size of a contact or via hole formed in an insulating layer (or an interlayer insulating layer) to electrically connect a wiring layer to patterns or a silicon substrate has been reduced.

Moreover, due to the increase of the integration density of semiconductor devices, a plurality of wiring layers are now currently being used. In this regard, the height of an insulating layer (or an interlayer insulating layer) formed between the wiring layers has been increased, thereby also increasing the aspect ratio of a contact or via hole formed in the insulating layer. When a contact or via hole having a large aspect ratio is formed in a thick insulating layer by general photolithography, the contact or via hole may not be correctly formed in a silicon substrate due to photolithography limitations.

For example, when a contact hole is formed in a thick insulating layer between gate patterns, the contact hole may be deeply recessed towards a silicon substrate, or the contact hole may be formed inclined towards the gate patterns. Thus, a contact plug filled in the contact hole can be connected to the gate pattern, thereby causing a short circuit. Even when a contact hole is correctly formed in an insulating layer, a metal layer for a contact plug may not be well filled in a contact hole having a large aspect ratio, which thereby in turn may result in an increase in the contact resistance.

In addition, when a plurality of contact holes are formed between gate patterns formed at small intervals, short circuits can be caused between contact plugs filled in the contact holes due to photolithography limitations and the small intervals between the gate patterns. Moreover, when a wiring layer is misaligned on a contact plug and an interlayer insulating layer, short circuits can be caused between the contact plug filled in a contact hole and the misaligned wiring layer.

Also, when a contact hole is formed in a thick insulating layer between gate patterns in order to form a plurality of semiconductor chips in a silicon wafer at a wafer level, the sizes or shapes of the contact holes formed in a semiconductor chip or in a silicon wafer may not be uniform. In this case, the yield of a semiconductor chip manufacturing process may be significantly reduced, which thereby in turn may increase the manufacturing costs of semiconductor chips.

SUMMARY OF THE INVENTION

Exemplary embodiments of the present invention provides a method of forming a wiring layer of a semiconductor layer, in which a contact or via hole can be formed correctly in a thick interlayer insulating layer (or an insulating layer) by using simple processes, thereby readily forming a contact plug and a wiring layer in the contact or via hole.

In accordance with an exemplary embodiment of the present invention, a method of forming a wiring layer of a semiconductor device is provided. The method includes forming a first interlayer insulating layer to have a first thickness that corresponds to a part of the thickness of an interlayer insulating layer that is to be formed on a support layer and forming a first contact plug in the first interlayer insulating layer. The method further includes forming a second interlayer insulating layer to have a second thickness on the first contact plug and the first interlayer insulating layer, thereby forming the interlayer insulating layer, wherein the second thickness corresponds to the rest of the thickness of the interlayer insulating layer, and forming a second contact plug connected to the first contact plug in the second interlayer insulating layer, thereby forming a local wiring layer including the first contact plug and the second contact plug.

The support layer may be a silicon substrate, and the method further comprises: forming a plurality of gate patterns on the silicon substrate; and forming the first contact plug so as to contact the silicon substrate between the gate patterns. The support layer may be a silicon substrate, and the method may further include forming a plurality of gate patterns on the silicon substrate: and forming an etch-stop layer covering the gate patterns.

The support layer may be a silicon substrate, and method may further include: forming a plurality of gate patterns on the silicon substrate: and forming the first contact plug so as to contact both an upper portion of each of the gate patterns and the silicon substrate between the gate patterns.

The forming of the first contact plug may comprise: forming a contact hole exposing the support layer in the first interlayer insulating layer; and filling the contact hole with a first metal layer and planarizing the first metal layer, and the forming of the second contact plug may include: forming a via hole exposing the first contact hole in the second interlayer insulating layer and filling the via hole with a second metal layer and planarizing the second metal layer, by using a single damascene process.

In accordance with another exemplary embodiment of the present invention, a method of forming a wiring layer of a semiconductor layer is provided. The method includes forming a first interlayer insulating layer to have a first thickness corresponding to a part of the thickness of an interlayer insulating layer that is to be formed on a support layer; forming a first contact plug in the first interlayer insulating layer, forming a second interlayer insulating layer to have a second thickness on the first contact plug and the first interlayer insulating layer, wherein the second thickness corresponds to the rest of the thickness of the interlayer insulating layer.

The method further includes forming a second contact plug connected to the first contact plug in the second interlayer insulating layer by using a single damascene process, thereby forming a local wiring layer including the first contact plug and the second contact plug, forming a wiring insulating layer on the second contact plug and the second interlayer insulating layer, and forming a wiring layer connected to the second contact plug in the wiring insulating layer by using a single damascene process.

In accordance with an exemplary embodiment of the present invention, a method of forming a wiring layer of a semiconductor layer is provided. The method includes forming a first interlayer insulating layer to have a first thickness corresponding to a part of the thickness of an interlayer insulating layer that is to be formed on a support layer, forming a first contact plug in the first interlayer insulating layer, forming a second interlayer insulating layer to have a second thickness on the first contact plug and the first interlayer insulating layer, wherein the second thickness corresponds to the rest of the thickness of the interlayer insulating layer, thereby forming the interlayer insulating layer and forming a wiring insulating layer on the second interlayer insulating layer. The method further includes forming an exposure hole exposing the first contact plug in the wiring insulating layer and the second interlayer insulating layer, and filling a metal layer in the exposure hole by using a dual damascene process, thereby forming a local wiring layer including the first contact plug and a second contact plug connected to the first contact plug and simultaneously forming a wiring layer connected to the second contact plug.

BRIEF DESCRIPTION OF THE DRAWINGS

Exemplary embodiments of the present invention can be understood in more detail from the following description taken in conjunction with the attached drawings in which.

DETAILED DESCRIPTION OF THE EXEMPLARY EMBODIMENTS OF THE INVENTION

Figure 1:
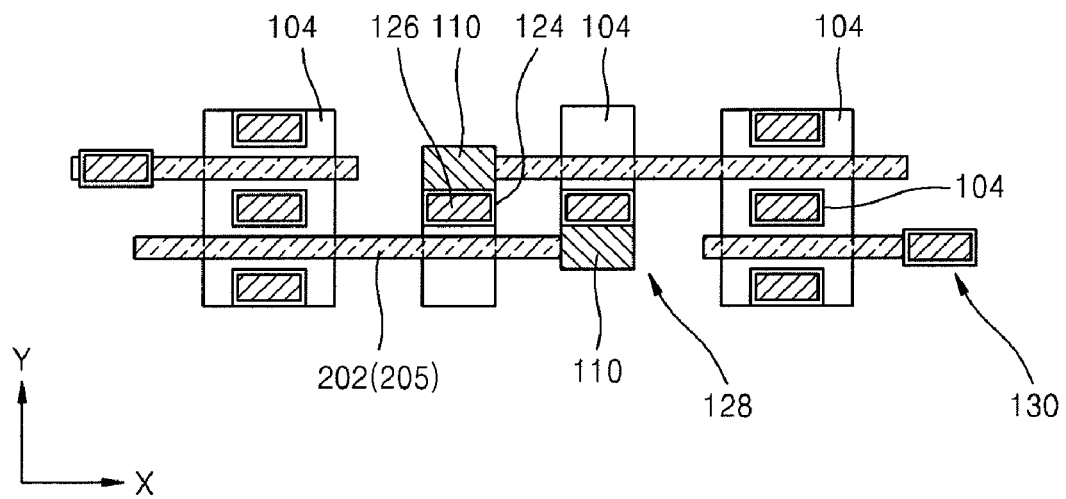
FIG. 1 is a plan view for illustrating a method of forming a wiring layer of a semiconductor device, according to an exemplary embodiment of the present invention.

The present invention will now be described more fully with reference to the accompanying drawings, in which exemplary embodiments of the invention are shown. The invention may, however, be embodied in many different forms and should not be construed as being limited to the exemplary embodiments set forth herein. Like reference numerals in the drawings denote the same elements.

First, the technical concept of the present invention will be described.

In the conventional art, when a wiring layer is formed, a contact plug is formed in a contact hole or a via hole formed in an interlayer insulating layer (or an insulating layer) by using only one photolithography step. However, according to exemplary embodiments of the present invention, a contact hole and a first contact plug filled in the contact hole are formed using a first photolithography step to have a height corresponding to a portion of the entire thickness of an interlayer insulating layer, and then a second contact plug connected to the first contact plug is formed using a second photolithography step to have a height corresponding to the rest of the entire thickness of the interlayer insulating, thereby completing the manufacture of a local wiring layer (or a local interconnection layer) including the first contact plug and the second contact plug. The local wiring layer can be formed using the first and second photolithography steps, but alternatively two or more photography steps may be performed to form the local wiring layer, if desired.

For example, a first interlayer insulating layer is formed to have a first thickness corresponding to a part of the entire thickness of the interlayer insulating layer. The contact hole is formed in the first interlayer insulating layer using the first photolithography step, and then the first contact plug is filled in the contact hole. In addition, a second interlayer insulating layer is formed to have a second thickness on the first contact plug and the first interlayer insulating layer, wherein the second thickness corresponds to the rest of the entire thickness of the interlayer insulating layer, thereby completing the manufacture of the interlayer insulating layer. Then, a via hole exposing the first contact plug is formed in the second interlayer insulating layer by using the second photolithography step, and the second contact plug connected to the first contact plug is filled in the via hole formed in the second interlayer insulating layer, thereby completing the manufacture of the local wiring layer including the first contact plug and the second contact plug.

Likewise, the contact hole having a low aspect ratio can be formed by etching the first interlayer insulating layer that is thinner than the interlayer insulating layer, thereby avoiding possible etching difficulties when forming the first interlayer insulating layer and preventing a metal layer from poorly filling the contact hole when forming the first contact plug. For example, the first contact plug is formed of tungsten, and the second plug is formed of copper or rhodium, thereby significantly reducing a contact resistance compared to the case where a contact hole is filled with tungsten so as to form the contact plug.

Moreover, an additional wiring layer can be formed on the local wiring layer including the first contact plug and the second contact plug, wherein the additional wiring layer is connected to the local wiring layer. To achieve this, a wiring insulating layer may be formed on the second contact plug which constitutes the local wiring layer and the second interlayer insulating layer, and a wiring layer connected to the second contact plug may be formed in the wiring insulating layer. The wiring layer can be formed by forming a trench exposing the second contact plug in the wiring insulating layer by using a single damascene process, filling the trench with a metal layer and then planarizing the metal layer. In addition, the second contact plug and the wiring layer can each be formed using a single damascene process.

In addition, according to exemplary embodiments of the present invention, a first interlayer insulating layer is formed to a have a first thickness corresponding to a part of the entire thickness of the interlayer insulating layer, a contact hole is formed in the first interlayer insulating layer by using the first photolithography step, and a first contact plug is filled in the contact hole. A second interlayer insulating layer is formed to have a second thickness on the first contact plug and the first interlayer insulating layer, wherein the second thickness corresponds to the rest of the entire thickness of the interlayer insulating layer, and then a wiring insulating layer is formed on the second interlayer insulating layer. An exposure hole including a via hole and a trench which expose the first contact plug is formed in the wiring insulating layer and the second interlayer insulating layer by using a dual damascene process, and the exposure hole is filled with a metal layer, thereby forming a local wiring layer including the first contact plug and the second contact plug connected to the first contact plug and simultaneously forming a wiring layer connected to the second contact plug.

According to exemplary embodiments of the present invention, the first contact plug and the wiring layer can each be formed using a single damascene process, or the second contact plug and the wiring layer can be formed using a dual damascene process. As described above, the contact plug includes the first contact plug and the second contact plug, and the second contact plug and the wiring layer are formed using a single damascene, or alternatively, the second contact plug and the wiring layer may be readily formed using a dual damascene process.

Thus, due to conductive patterns, for example, gate patters adjacent to the first contact plug, short circuits can be prevented between the wiring layer and the conductive patterns or between the gate patterns, and the first contact plug can be formed correctly on the gate patterns or the support layer. Hereinafter, exemplary embodiments of the present invention according to the above-described technical concept will now be described in more detail.

Figure 2:
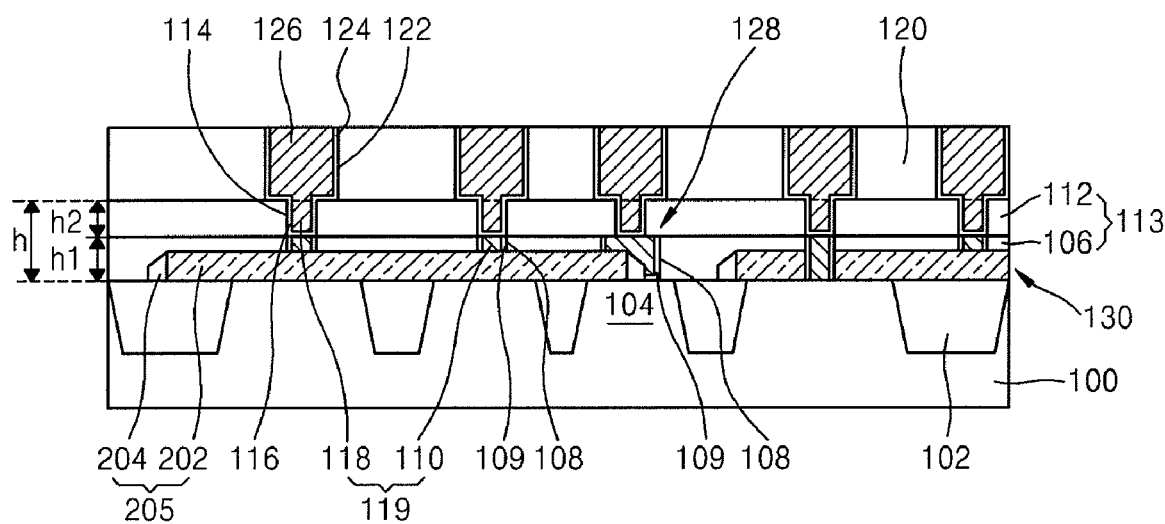
FIG. 2 is a perspective view of the semiconductor device taken along a horizontal direction (e.g., an x-axis direction) of FIG. 1, for illustrating the method of forming the wiring layer of the semiconductor device.

FIG. 1 is a plan view for illustrating a method of forming a wiring layer 126 of a semiconductor device, according to an exemplary embodiment of the present invention. FIG. 2 is a perspective view of the semiconductor device taken along a horizontal direction (e.g., an x-axis direction) of FIG. 1, for illustrating the method of forming the wiring 126 layer of the semiconductor device.

Referring to FIGS. 1 and 2, an isolation layer 102 and an active region 104 defined by the isolation layer 102 are formed on a support layer 100, for example, a silicon substrate. The locations and shapes of the isolation layer 102 and the active region 104 may vary according to a semiconductor device to be formed. Hereinafter, the silicon substrate is just an example of the support layer 100, and the support layer 100 may be, for example, a polysilicon layer doped with impurities.

A first interlayer insulating layer 106 is formed to have a first thickness "h1" on the support layer 100, wherein the first thickness "h1" corresponds to a part of the thickness "h" of an interlayer insulating layer 113 (or an insulating layer). The first interlayer insulating layer 106 may be, for example, an oxide layer. The first thickness "h1" may be half or less than half of the thickness "h" of the interlayer insulating layer 113. Contact holes 108 are formed in the first interlayer insulating layer 106 by photolithography. A first barrier layer 109 and a first contact plug 110 are formed in the contact hole 108. The first barrier layer 109 may be composed of various film materials. For example, the first barrier layer 109 may be a titanium (Ti)/titanium nitride (TiN) layer or a tantalum (Ta)/tantalum nitride (TaN) layer. The first contact plug 110 may be formed of a first metal layer, for example, a tungsten layer.

As the contact hole 108 is formed in the first interlayer insulating layer 106 of which thickness "h1" is less than the thickness "h" of the interlayer insulating layer 113, the aspect ratio of the first interlayer insulating layer 106 is relatively low, thereby reducing possible etching difficulties when forming the contact hole 108. In addition, the first contact plug 110 can be formed in the contact hole 108 without filling errors. As the contact hole 108 is formed in the first interlayer insulating layer 106 of which thickness "h1" is less than the thickness "h" of the interlayer insulating layer 113 by photolithography, the contact hole 108 can be formed correctly on the support layer 100.

For example, as illustrated in FIGS. 1 and 2, the first contact plugs 110 may be formed between gate patterns 205 which each include a gate electrode 202 and a gate spacer 204, on the active region 104 of the support layer 100 (e.g., the silicon substrate), on the gate pattern 205, or to contact both the gate pattern 205 and the active region 104.

For example, in the vicinity of a first region 128 illustrated in FIGS. 1 and 2, the first contact plug 110 is formed to contact both the gate pattern 205 and the active region 104 of the support layer 100 (e.g., the silicon substrate). In the vicinity of a second region 130 illustrated in FIGS. 1 and 2, the first contact plug 110 is formed on the gate pattern 205. The first thickness "h1" of the first interlayer insulating layer 106 may be greater than the thickness of the gate pattern 205.

As described above, as the first contact plugs 110 may be formed between the gate patterns 205, on the gate patterns 205, on the active region 104, or to contact both the gate pattern 205 and the active region 104, when the first interlayer insulating layer 106 is thinner than the interlayer insulating layer 113, the contact holes 108 and the first contact plugs 110 can be correctly and readily formed.

A second interlayer insulating layer 112 is formed to have a second thickness "h2" on the first contact plug 110 and the first interlayer insulating layer 106, wherein the second thickness "h2" corresponds to the rest of the thickness "h" of the interlayer insulating layer 113. The second interlayer insulating layer 112 may be, for example, an oxide layer. Via holes 114 are formed in the second interlayer insulating layer 112. A second barrier layer 116 and a second contact plug 118 are formed in the via hole 114.

The second barrier layer 116 may be formed of the same film material as the first barrier layer 109. The second contact plug 118 may be a second metal layer, for example, a tungsten layer, a copper layer or a rhodium layer. The second contact plug 118 may be formed using a single damascene process, thereby completing the manufacture of a local wiring layer 119 including the first contact plug 110 and the second contact plug 118 connected to the first contact plug 110.

As the first contact plug 110 formed in the first interlayer insulating layer 106 is formed of a tungsten layer, and the second contact plug 118 formed in the second interlayer insulating layer 112 is formed of a copper or rhodium layer, the contact resistance can be significantly reduced compared to the case where a contact plug is formed of a tungsten layer.

A wiring insulating layer 120 is formed on the second contact plug 118 and the second interlayer insulating layer 112. A trench 122 is formed in the wiring insulating layer 120, and a third barrier layer 124 and the wiring layer 126 are formed in the trench 122. The wiring layer 126 is composed of a third metal layer, for example, a tungsten layer, a copper layer or a rhodium layer. The wiring layer 126 is connected to the second contact plug 118. The wiring layer 126 and the second contact plug 118 may be formed using a dual damascene process.

Likewise, as described above, a contact plug 110 and 118 is divided into the first contact plug 110 and the second contact plug 118. The second contact plug 118 and the wiring layer 126 may each be formed using a single damascene process, or alternatively, the second contact plug 118 and the wiring layer 126 may be formed using a dual damascene process. Thus, short circuits can be prevented between the wiring layer 126 and the gate pattern 205 or between the gate patterns 205, and the first contact plug 110 can be formed correctly on the gate pattern 205 or on the support layer 100.

Figure 3:
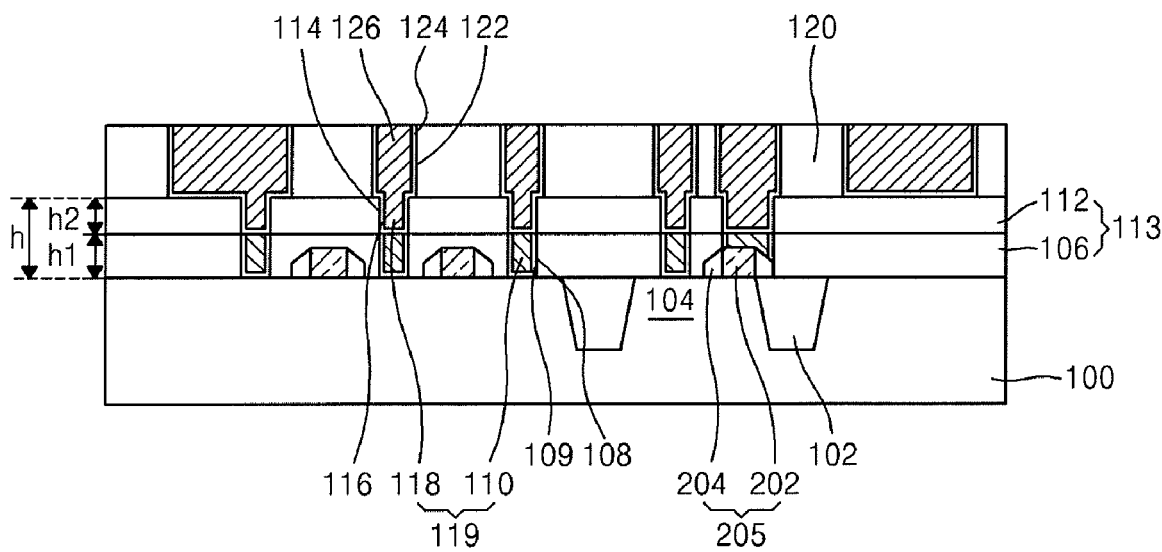
FIG. 3 is a cross-sectional view of a semiconductor device formed according to an exemplary embodiment of the present invention.
Figure 4:
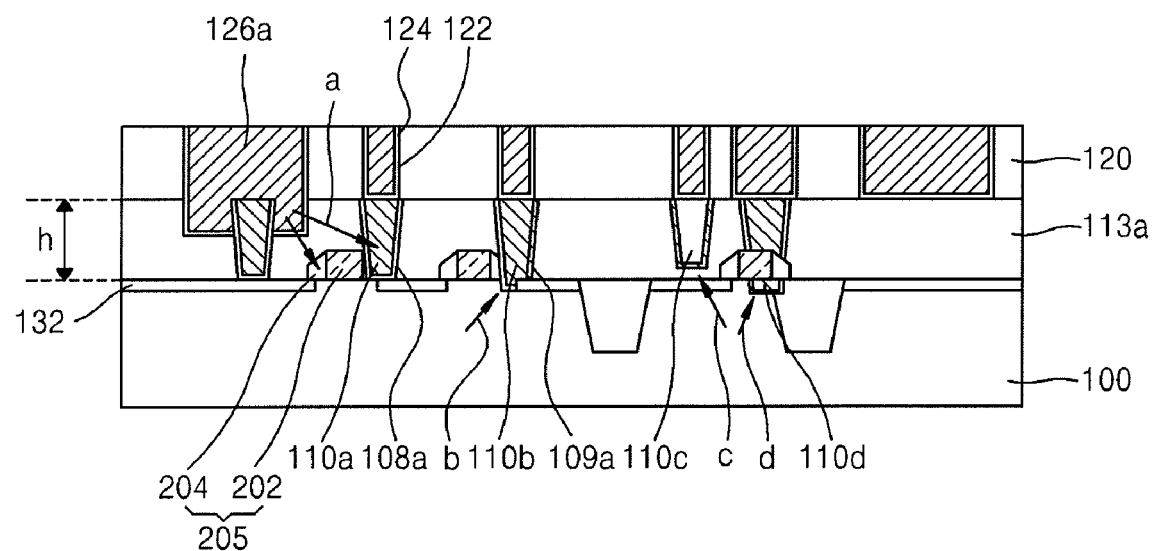
FIG. 4 is a cross-sectional view of a semiconductor device manufactured according to a comparative example.

FIG. 3 is a cross-sectional view of a semiconductor device formed according to an exemplary embodiment of the present invention. FIG. 4 is a cross-sectional view of a semiconductor device manufactured according to a comparative example.

For example, with regard to the semiconductor device of FIG. 3, first contact plugs 110 are formed between gate patterns 205 of a support layer 100 (e.g., a silicon substrate), or on the gate patterns 205. The plurality of gate patterns 205 are formed on the support layer 100 (e.g., the silicon substrate), wherein the gate patterns 205 each include a gate electrode 202 and a gate spacer 204. For convenience, the description of a gate insulating layer formed on the silicon substrate and constituting the gate pattern 205 will not be presented.

As described above, a first interlayer insulating layer 106 formed to have a first thickness "h1" on the support layer 100, wherein the first thickness "h" corresponds to a part of the thickness "h" of an interlayer insulating layer 113 (or, an insulating layer). With regard to the semiconductor device of FIG. 3, contact holes 108 are formed in the first interlayer insulating layer 106 between the gate patterns 205, and a first barrier layer 109 and the first contact plug 110 are formed in the contact hole 108. The first contact plug 110 contacts the support layer 100 (e.g., the silicon substrate) between the gate patterns 205.

Likewise, the contact holes 108 are formed between the gate patterns 205 that are formed at small intervals, and are formed on the gate pattern 205. In addition, the contact holes 108 are readily formed in the first interlayer insulating layer 106 of which thickness "h1" is less than the thickness "h" of the interlayer insulating layer 113. Thus, the distance between the gate patterns 205 can be maintained, thereby preventing short circuits between the first contact plug 110 and the gate pattern 205.

A second interlayer insulating layer 112 is formed to have a second thickness "h2" on the first contact plug 110 and the first interlayer insulating layer 106, wherein the second thickness "h2" corresponds to the rest of the thickness "h" of the interlayer insulating layer 113. Via holes 114 are formed in the second interlayer insulating layer 112. A second barrier layer 116 and a second contact plug 118 are formed in the via hole 114. The first contact plug 110 comes in contact with the second contact plug 118, thereby completing the manufacture of a local wiring layer 119. A wiring insulating layer 120 is formed on the second contact plug 118 and the second interlayer insulating layer 112. A trench 122 is formed in the wiring insulating layer 120. A third barrier layer 124 and a wiring layer 126 are formed in the trench 122. The wiring layer 126 is connected to the second contact plug 118.

On the other hand, in the semiconductor device of FIG. 4, an interlayer insulating layer 113a is formed to have a thickness "h" on a support layer 100. With regard to the semiconductor device of FIG. 4, a contact hole 108a is formed in the interlayer insulating layer 113a between gate patterns 205, and a first barrier layer 109a and contact plugs 110a, 110b and 110c are formed in a contact hole 108a. A wiring insulating layer 120 is formed on the contact plugs 110a, 110b and 110c and the interlayer insulating layer 113a, and a trench 122 is formed in the wiring insulating layer 120. A second barrier layer 124 and a wiring layer 126a are formed in the trench 122. The wiring layer 126a is connected to the contact plugs 110a, 110b and 110c.

However, in the semiconductor device of FIG. 4, as the contact hole 108a is formed in the interlayer insulating layer 113a having the thickness "h", the contact hole 108a cannot be formed correctly on a silicide layer 132 or a gate pattern 205 of the support layer 100 due to photolithography limitations. Thus, in the vicinity of a reference character "b" illustrated in FIG. 4, the contact hole 108a is misaligned, and thus the contact plug 110b may not be correctly connected to the silicide layer 132 of the support layer 100 (e.g., the silicon substrate), or may be recessed. In the vicinity of a reference character "c" illustrated in FIG. 4, the contact hole 108a is not exposed, and thus the contact plug 110c may not contact the support layer 100. In the vicinity of a reference character "d", the contact hole 108a may be overetched, thereby damaging the supporting layer 100. In addition, in the vicinity of a reference character "a" illustrated in FIG. 4, when the wiring layer 126a is formed in the trench 122 that is overetched in the interlayer insulating layer 113a, short circuits may be caused between the wiring layer 126a and the contact plug 110a or between the wiring layer 126a and the gate pattern 205. Thus, the semiconductor device of FIG. 3 can overcome the various difficulties associated with the semiconductor device of FIG. 4.

Figure 5:
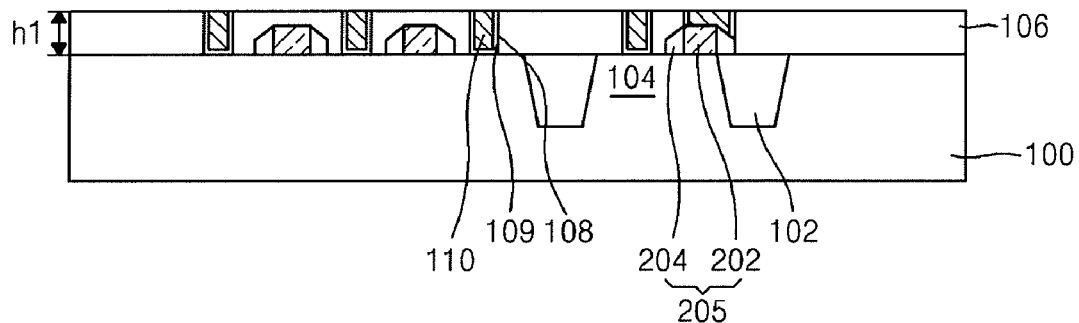
FIGS. 5 through 7 are cross-sectional views for illustrating a method of forming a wiring layer of a semiconductor device, according to an exemplary embodiment of the present invention.
Figure 6:
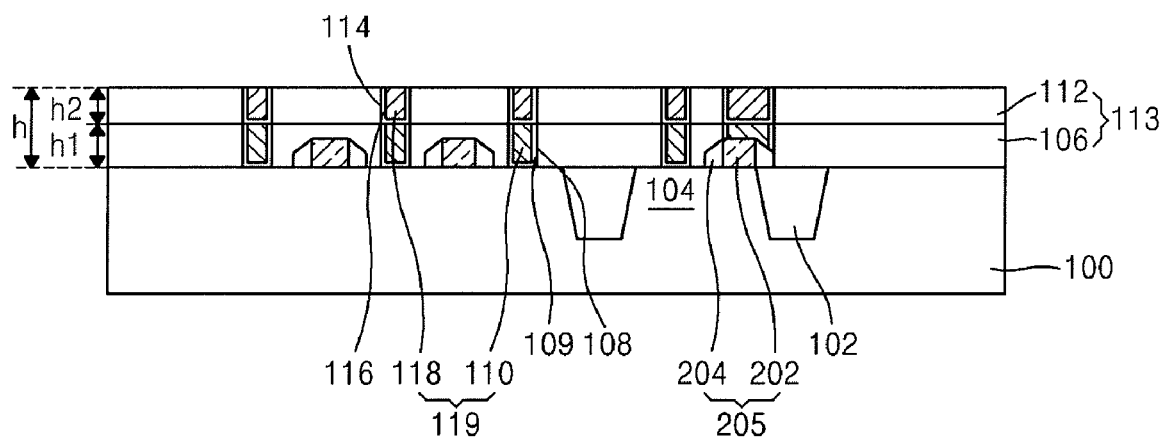
Figure 7:
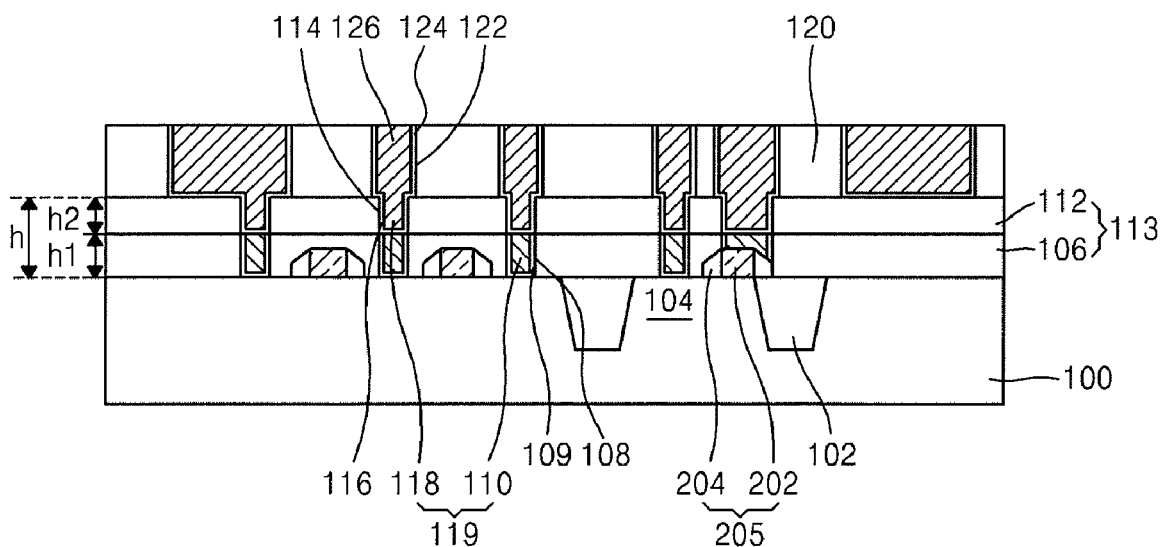

FIGS. 5 through 7 are cross-sectional views for illustrating a method of forming a wiring layer 126 of a semiconductor device, according to an exemplary embodiment of the present invention.

Referring to FIG. 5, an isolation layer 102 and an active region 104 defined by the isolation layer 102 are formed on a support layer 100, for example, a silicon substrate. The locations and shapes of the isolation layer 102 and the active region 104 may vary according to the semiconductor device to be formed. A gate pattern 205 including a gate electrode 202 and a gate spacer 204 is formed on the support layer 100. A first interlayer insulating layer 106 is formed to have a first thickness "h1" on the support layer 100, wherein the first thickness "h1" corresponds to a part of the thickness "h" of an interlayer insulating layer 113 (or an insulating layer) that is to be formed in a subsequent process. The first interlayer insulating layer 106 may be, for example, an oxide layer. The first thickness "h1" may be half or less than half of the thickness "h" of the interlayer insulating layer 113. The first thickness "h1" of the first interlayer insulating layer 106 may be greater than the thickness of the gate pattern 205.

A contact hole 108 exposing the support layer 100 thereon is formed in a first interlayer insulating layer 108 using photolithography. The contact hole 108 is formed using a contact mask. The contact holes 108 may be formed between the gate patterns, or on the gate pattern 205. As described above, the contact hole 108 may be commonly formed on the gate pattern 205 and the support layer 100. As the contact hole 108 is formed on the first interlayer insulating layer 108 that is thinner than the interlayer insulating layer 113 that is to be formed in a subsequent process, the contact hole 108 can be readily formed at a desired location regardless of photolithography limitations.

A first barrier layer 109 is formed on an inner barrier and a bottom of the contact hole 108, and then, a metal layer, for example a tungsten layer is formed and planarized so as to sufficiently fill the contact hole 108, thereby completing the manufacture of the first contact plug 110. The planarization is performed by a chemical mechanical polishing (CMP). Likewise, as the contact hole 108 can be readily formed on the first interlayer insulating layer 106 that is thinner than the interlayer insulating layer 113 regardless of difficulties in etching the contact hole 108, and the first contact plug 110 can be readily formed also in the contact hole 108 without filling errors.

In addition, the contact holes 108 may be formed between the gate patterns 205 that are formed at small intervals, or on the gate pattern 205. In addition, the contact holes 108 may be readily formed on the first interlayer insulating layer 106 of which thickness "h1" is less than the thickness "h" of the interlayer insulating layer 113. Thus, the distance between the gate patterns 205 can be maintained, thereby preventing short circuits between the first contact plug 110 and the gate pattern 205.

Referring to FIG. 6, a second interlayer insulating layer 112 is formed to have a second thickness "h2" on the first contact plug 110 and the first interlayer insulating layer 106, wherein the second thickness "h2" corresponds to the rest of the thickness "h" of the interlayer insulating layer 113. The second interlayer insulating layer 112 may be, for example, an oxide layer. Via holes 114 exposing the first contact plug 110 are formed in the second interlayer insulating layer 112 using photolithography. The via hole 114 is formed using the contact mask that was previously used in forming the contact hole 108. That is, the contact hole 108 and the via hole 114 are formed using the same contact mask, thereby reducing the manufacturing costs.

A first barrier layer 116 is formed on an inner barrier and a bottom of the via hole 114, and then a second metal layer, for example, a tungsten, copper or rhodium layer is formed and planarized so as to sufficiently fill the via hole 114, thereby completing manufacture of the second contact plug 118. The planarization is performed by CMP. When the second metal layer is a copper layer, the second metal layer is formed using electroplating. When the second metal layer is a rhodium layer, electroplating may not be used. The second contact plug 118 may be formed using a single damascene process, thereby completing the manufacture of a local wiring layer 119 including the first contact plug 110 and the second contact plug 118 connected to the first contact plug 110.

As the first contact plug 110 formed in the first interlayer insulating layer 106 is formed of a tungsten layer, and the second contact plug 118 formed in the second interlayer insulating layer 112 is formed of a copper or rhodium layer, the contact resistance can be significantly reduced compared to the case where a contact plug is formed of a tungsten layer.

Referring to FIG. 7, a wiring insulating layer 120 is formed on the second contact plug 118 and the second interlayer insulating layer 112. The wiring layer 126 is formed in the wiring insulating layer 120 so that the wiring layer 126 comes in contact with the second contact plug 118. The wiring layer 126 is formed using a single damascene process. That is, a trench 122 exposing the second contact plug 117 is formed in the wiring insulating layer 120.

A second barrier layer 124 is formed on an inner barrier (wall) and a bottom of the trench 122, and then a third metal layer, for example, a tungsten, copper or rhodium layer is formed and planarized so as to sufficiently fill the trench 122, thereby completing the manufacture of the wiring layer 126. When the third metal layer is a copper layer, the third metal layer is formed using electroplating. When the third metal layer is a rhodium layer, electroplating may not be used. The planarization is performed using CMP. Thus, the wiring layer 126 is connected to the second contact plug 118.

Figure 8:
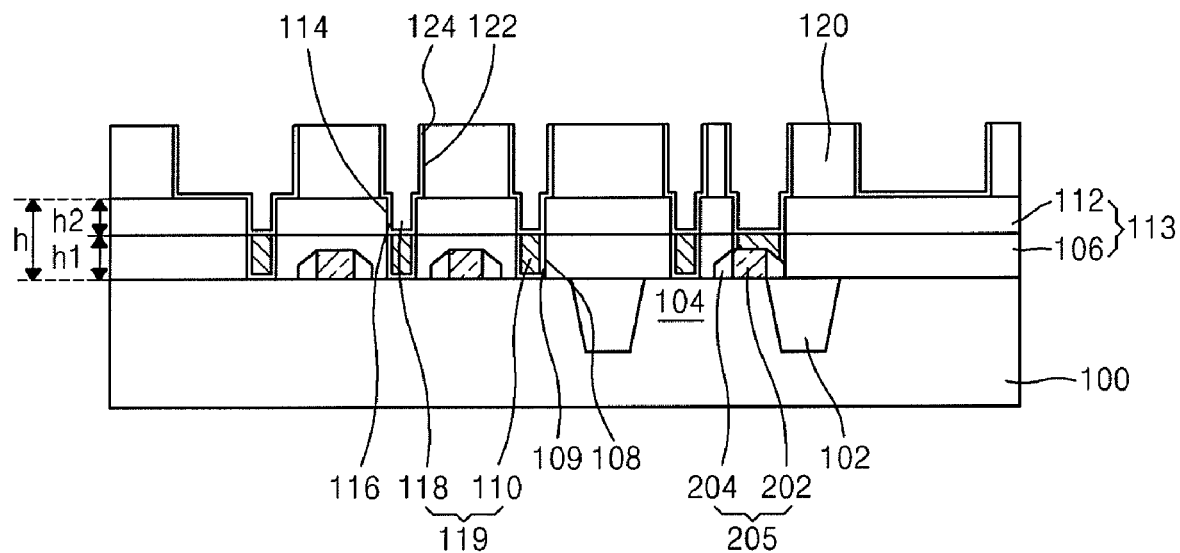
FIGS. 8 and 9 are cross-sectional views for illustrating a method of forming a wiring layer of a semiconductor device, according to an exemplary embodiment of the present invention.
Figure 9:
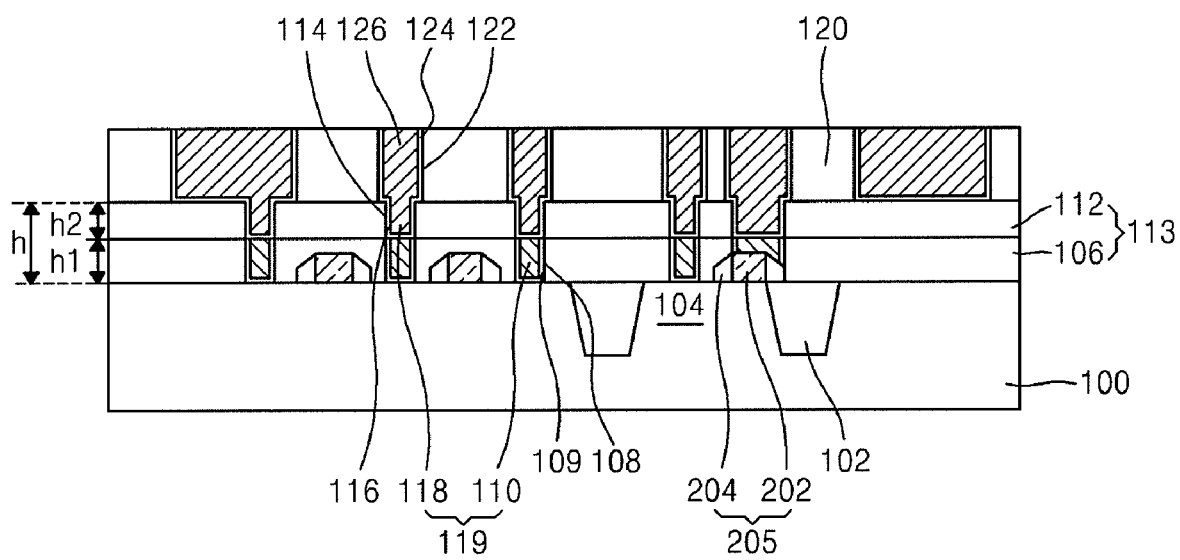

FIGS. 8 and 9 are cross-sectional views for illustrating a method of forming a wiring layer 126 of a semiconductor device, according to another exemplary embodiment of the present invention.

Referring to FIGS. 8 and 9, the method of FIGS. 8 and 9 is similar to the method of FIG. 1 except that the second contact plug 118 and the wiring layer 126 are formed using a dual damascene process. Referring back to FIG. 5, a first interlayer insulating layer 106 is formed to have a first thickness "h1" on the support layer 100, wherein the first thickness "h1" corresponds to part of the thickness "h" of an interlayer insulating layer 113 (or an insulating layer) that is to be formed in a subsequent process. A contact hole 108 is formed in the first interlayer insulating layer 106 using photolithography. A first barrier layer 109 and a first contact plug 110 are formed in the contact hole 108. The first contact plug 110 is formed of a first metal layer, for example, a tungsten layer.

As illustrated in FIG. 8, a second interlayer insulating layer 112 is formed to have a second thickness "h2" on the first contact plug 110 and the first interlayer insulating layer 106, wherein the second thickness "h2" corresponds to the rest of the thickness "h" of the interlayer insulating layer 113. A wiring insulating layer 120 is formed on the second interlayer insulating layer 112. The second contact plug 118 and the wiring layer 126 are formed in the second interlayer insulating layer 112 and the wiring insulating layer 120, respectively, thereby completing the manufacture of a wiring. The second contact plug 118 and the wiring layer 126 are formed using a dual damascene process.

That is, exposure holes 114 and 122 are formed in the wiring insulating layer 120 and the second interlayer insulating layer 112, respectively, using photolithography, so that the exposure holes 114 and 122 exposes the first contact plug 110 thereon. The exposure holes 114 and 122 are completed by forming a trench 122 in the wiring insulating layer 120 and then forming a via hole 114 in the second interlayer insulating layer 112 below the trench 122, so that the via hole 114 exposes the first contact plug 110. The operation order in forming the trench 122 and the via hole 114 may be reversed. The via hole 114 may be formed using a contact mask used for the contact hole 108, or alternatively, may be formed using a separate contact mask for forming the via hole 114. When the separate contact mask is used for forming the via hole 114, a process margin of subsequent processes can be increased for forming the second contact plug 118.

Next, as illustrated in FIG. 9, a metal layer is filled in the exposure holes 114 and 122, thereby completing the manufacture of a local wiring layer 119 including the first contact plug 110 and the second contact plug 118 connected to the first contact plug 110 and simultaneously completing the manufacture of the wiring layer 126 connected to the second contact plug 118. That is, the metal layer is filled in the exposure holes 114 and 122 and is planarized, thereby completing the manufacture of the second contact plug 118 and the wiring layer 126. The wiring layer 126 and the second contact plug 118 are formed of a second metal layer, for example, a tungsten, copper or rhodium layer. When the second metal layer is formed of a copper layer, the second metal layer may be formed using electroplating. When the second layer is a rhodium layer, electroplating may not be used.

Figure 10:
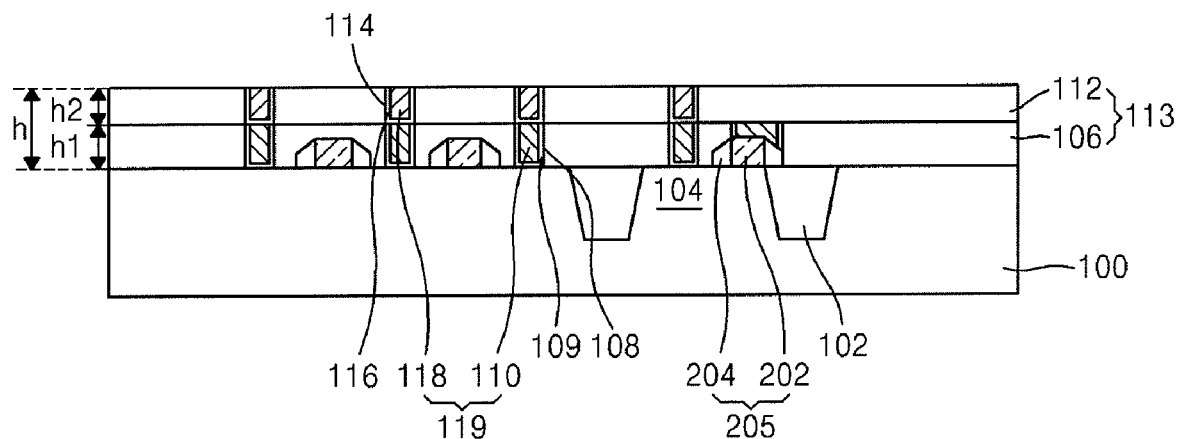
FIGS. 10 and 11 are cross-sectional views for illustrating a method of forming a wiring layer of a semiconductor device, according to an exemplary embodiment of the present invention.
Figure 11:
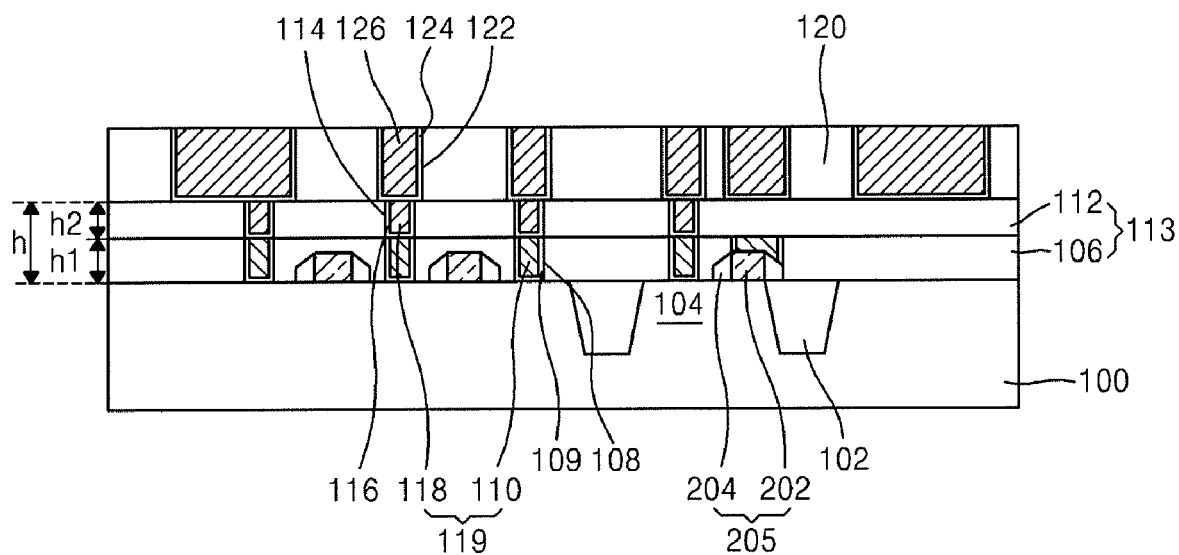

FIGS. 10 and 11 are cross-sectional views for illustrating a method of forming a wiring layer 126 of a semiconductor device, according to another exemplary embodiment of the present invention.

Referring to FIGS. 10 and 11, the method of FIGS. 10 and 11 is similar to the method of FIGS. 8 and 9 except that a separate contact mask is used for forming a via hole 114. Referring back to FIG. 5, a first interlayer insulating layer 106 is formed to a have first thickness "h1" on the support layer 100, wherein the first thickness "h1" corresponds to a part of the thickness "h" of an interlayer insulating layer 113 (or an insulating layer) that is to be formed in a subsequent process. A contact hole 108 is formed in the first interlayer insulating layer 106 using photolithography. A first barrier layer 109 and a first contact plug 110 are formed in the contact hole 108.

As illustrated in FIG. 10, a second interlayer insulating layer 112 is formed to have a second thickness "h2" on the first contact plug 110 and the first interlayer insulating layer 106, wherein the second thickness "h2" corresponds to the rest of the thickness "h" of the interlayer insulating layer 113. Next, the via hole 114 exposing the first contact plug 110 is formed in the second interlayer insulating layer 112 using photolithography. The first contact plug 110 may be formed of a first metal layer, for example, a tungsten layer. In FIG. 10, the separate contact mask is used for forming the via hole 114. In FIG. 10, in comparison to FIG. 6, the via hole 114 is not formed in the second interlayer insulating layer 112 corresponding to the gate pattern 205. When the separated the separate contact mask is used for forming contact holes 114, a process margin of subsequent processes can be increased for forming the second contact plug 118.

Next, referring back to FIG. 6, a first barrier layer 116 and a second contact plug 118 are formed in the via hole 114. The second contact plug 118 is formed using a signal damascene process. The second contact plug 118 is formed of a second layer, for example, a tungsten, copper and rhodium layer. When the second metal layer is a copper layer, the second metal layer may be formed using electroplating. When the second metal layer is a rhodium layer, electroplating may not be used. Thus, a local wiring layer 119 is formed, wherein the local wiring layer 119 includes the first contact plug 110 and the second contact plug 118 connected to the first contact plug 110.

As illustrated in FIG. 11, a wiring insulating layer 120 is formed on the second contact plug 118 and the second interlayer insulating layer 112. Next, referring back to FIG. 7, a trench 122 is formed in the wiring insulating layer 120, and a second barrier layer 124 and a wiring layer 126 are formed in the trench 122. The wiring layer 126 is formed using a single damascene process. The wiring layer 126 is formed of a third layer, for example, a tungsten, copper or rhodium layer. When the third layer is a copper layer, the third metal layer may be formed using electroplating. When the third layer is a rhodium layer, electroplating may not be used.

FIGS. 12 through 15 are cross-sectional views for illustrating a method of forming a wiring layer 126 of a semiconductor device, according to another exemplary embodiment of the present invention.

Figure 12:
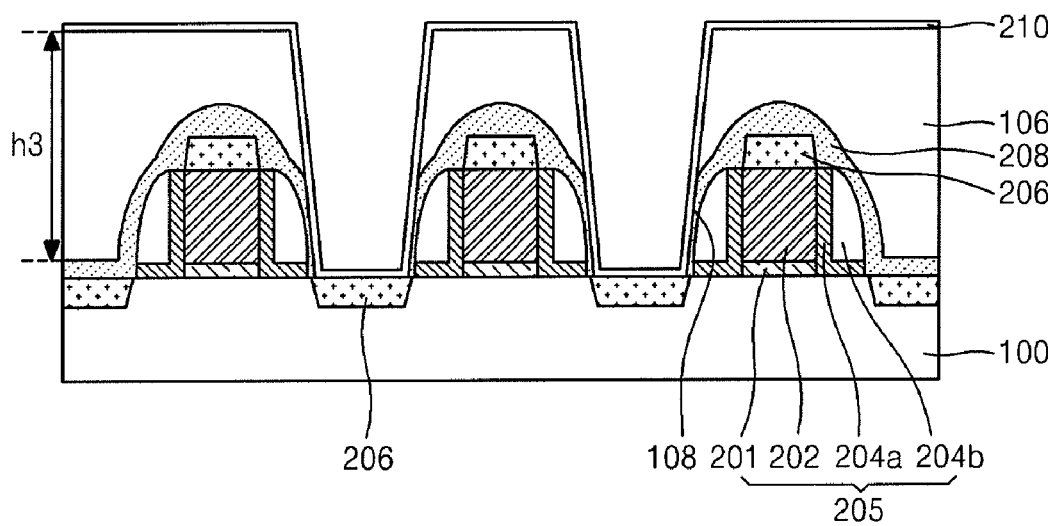
FIGS. 12 through 15 are cross-sectional views for illustrating a method of forming a wiring layer of a semiconductor device, according to an exemplary embodiment of the present invention.

Referring to FIG. 12, a plurality of gate patterns 205 are formed on a support layer 100, for example, a silicon substrate, wherein the gate pattern 205 includes a gate insulating layer 201, a gate electrode 202, and first and second gate spacers 204a and 204b. The first gate spacer 204a has an "L" shape, and is formed on both barriers of the gate electrode 202 and on the support layer 100. The second gate spacer 204b is formed on the "L" shaped first gate spacer 204a. Metal silicide layers 206 are formed on the support layer 100 between the gate patterns 205 or on the gate electrode 205. For example, the metal silicide layer 206 may be a tungsten, cobalt, or nickel layer.

An etch-stop layer 208 is formed so as to cover the gate pattern 205 and the metal silicide layer 206. The etch-stop layer 208 may be, for example, a nitride layer. A first interlayer insulating layer 106 is formed to have a thickness "h3" on the etch-stop layer 208, wherein the thickness "h3" corresponds to a part of the thickness "h" of an interlayer insulating layer 113 (or an insulating layer). The thickness "h3" may be determined according to the etching depth of a subsequent process so that the first interlayer insulating layer 106 having the thickness "h1" is disposed above the etch-stop layer 208.

Next, a contact hole 106 exposing the support layer 100 is formed in the first interlayer insulating layer 106 using photolithography. The contact hole 108 is formed using a contact mask. The contact hole 108 is formed between the gate patterns 205. As the contact hole 108 is formed in the first interlayer insulating layer 106 having the thickness "h3" that is less than the thickness "h" of the interlayer insulating layer 113 that is to be formed in a subsequent process, the contact hole 108 can be formed regardless of photolithography limitation.

If desired, to reduce the size of the contact hole 108, an additional insulating layer 210, for example, an oxide layer, may be formed on an inner barrier (wall) of the contact hole 108. For example, the additional insulating layer 210 can be readily formed in the contact hole 108 that is formed in the first interlayer insulating layer 106 having the thickness "h3" less than the thickness "h" of the interlayer insulating layer 113.

Figure 13:
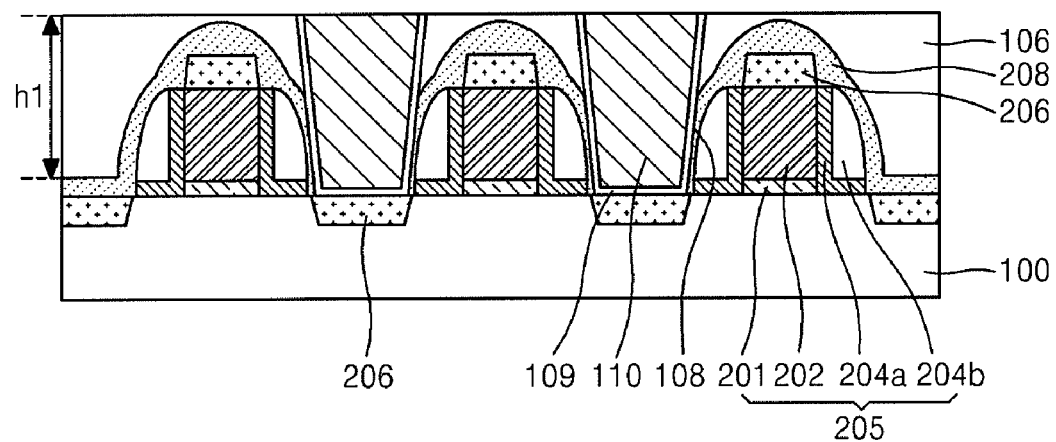

Referring to FIG. 13, for convenience, the additional insulating layer 210 is not illustrated. A first barrier layer 109 is formed on an inner barrier and a bottom of the contact hole 108, and then a first metal layer, for example, a tungsten layer is formed and planarized so as to sufficiently fill the contact hole 108, thereby completing the manufacture of the first contact plug 110. When the first metal layer is planarized, the thickness of the first interlayer insulating layer 106 is reduced to a first thickness "h1" that corresponds to a part of the thickness "h" of the interlayer insulating layer 113 (or an insulating layer). The first thickness "h1" may be half or less than half of the thickness "h" of the interlayer insulating layer 113. The planarization is performed by CMP. As the first metal layer is formed in the contact hole 108 that is formed in the first interlayer insulating layer 106 having the thickness "h3" less than the thickness "h" of the interlayer insulating layer 113, the first contact plug 110 can be readily formed without filling errors.

Figure 14:
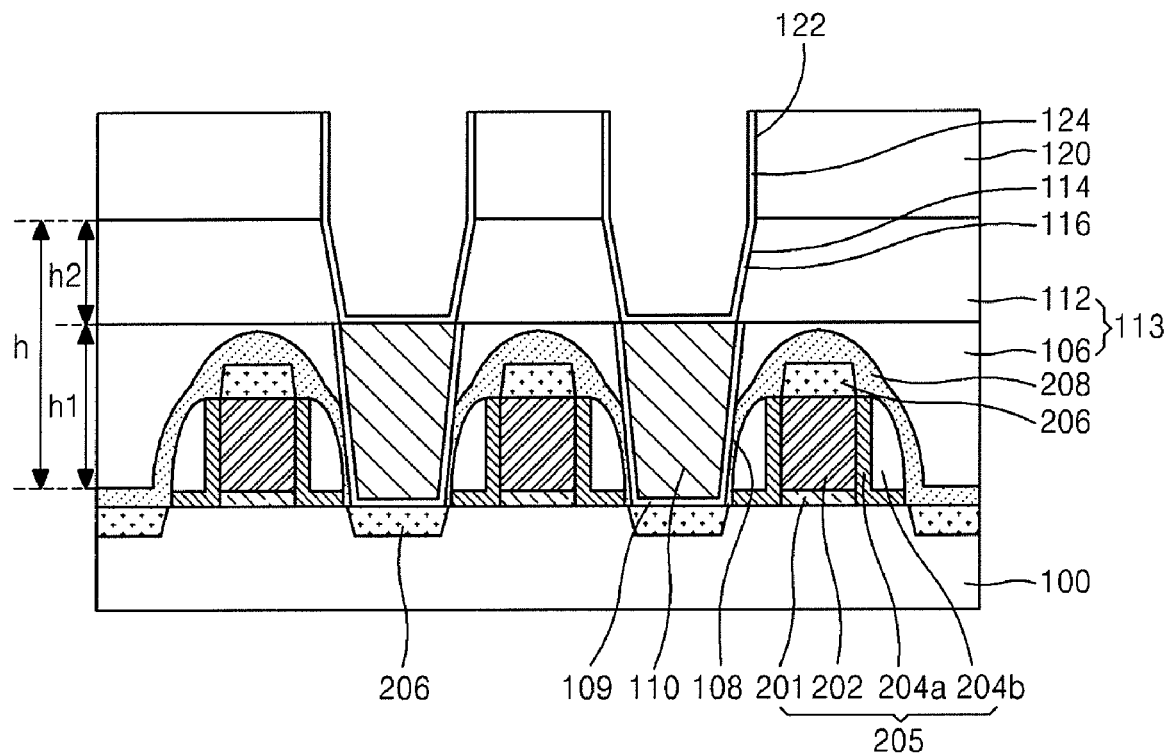
Figure 15:
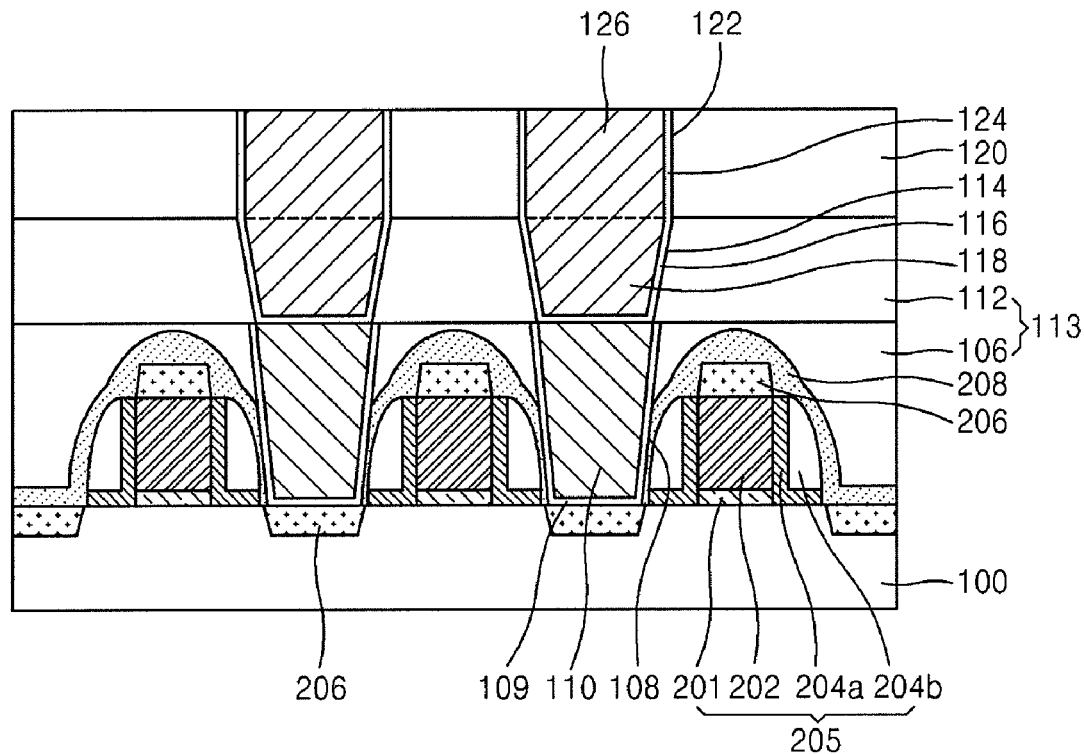

Referring to FIGS. 14 and 15, a second interlayer insulating layer 112 is formed to have a second thickness "h2" on the first contact plug 110 and the first interlayer insulating layer 106, wherein the second thickness "h2" corresponds to the rest of the thickness "h" of the interlayer insulating layer 113. Next, referring back to FIGS. 8 and 9, a wiring insulating layer 120 is formed on the second interlayer insulating layer 112. The second contact plug 118 and the wiring layer 126 are formed in the second interlayer insulating layer 112 and the wiring insulating layer 120, respectively, thereby completing the manufacture of a wiring. The second contact plug 118 and the wiring layer 126 are formed using a dual damascene process. The second contact plug 118 and the wiring layer 126 may be formed of a second metal layer, for example, a tungsten, copper or rhodium layer. When the second metal layer is a copper layer, the second metal layer may be formed using electroplating. When the second metal layer is a rhodium layer, electroplating may not be used. A dual damascene process is well known in the art, and thus its description will not be given here.

Figure 16:
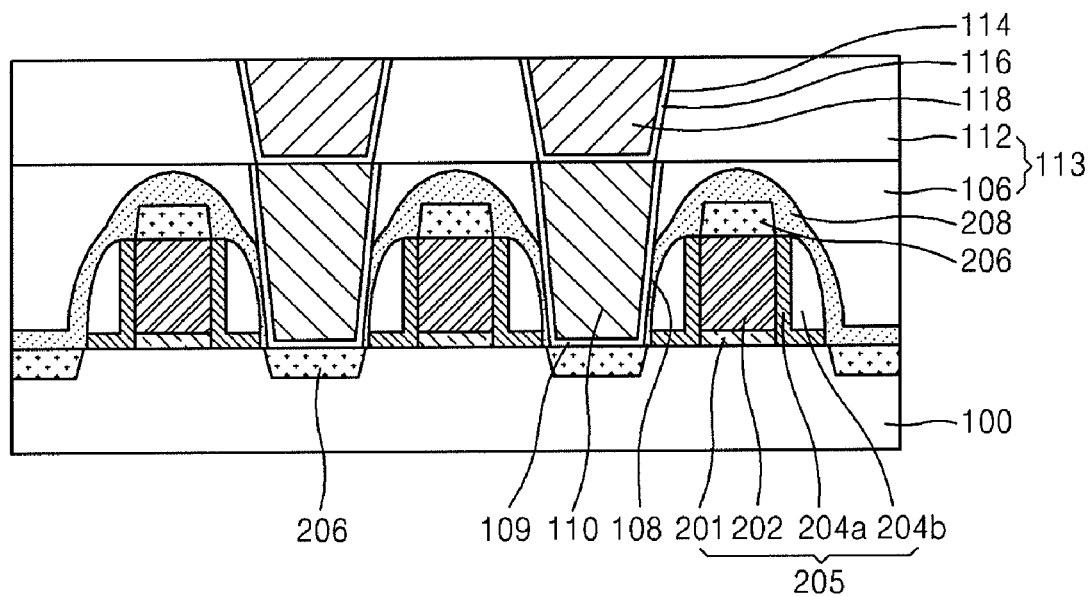
FIGS. 16 and 17 are cross-sectional views for illustrating a method of forming a wiring layer of a semiconductor device, according to an exemplary embodiment of the present invention.
Figure 17:
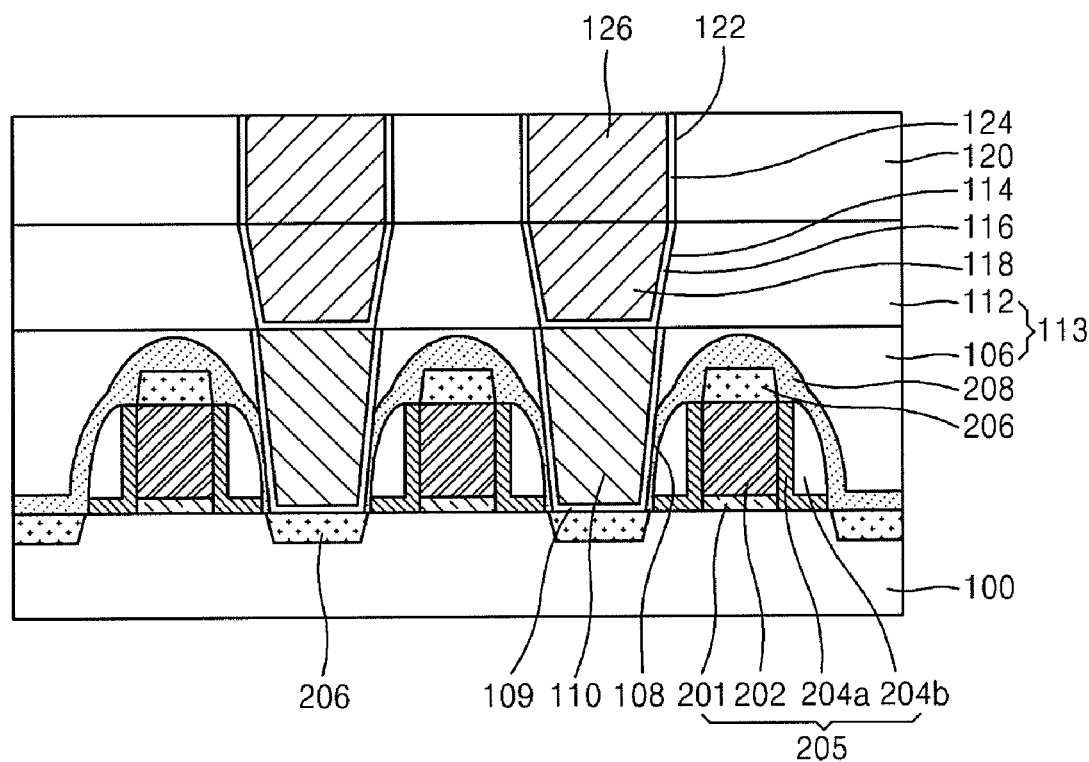

FIGS. 16 and 17 are cross-sectional views for illustrating a method of forming a wiring layer 126 of a semiconductor device, according to another exemplary embodiment of the present invention.

Referring to FIGS. 16 and 17, the method of FIGS. 16 and 17 is similar to the method of 12 through 15 except that a second contact plug 118 and a wiring layer 126 are formed using a single damascene process. Referring back to FIG. 13, a first interlayer insulating layer 106 is formed to have a first thickness "h1" on the support layer 100, wherein the first thickness "h1" corresponds to a part of the thickness "h" of an interlayer insulating layer 113 (or an insulating layer) that is to be formed in a subsequent process. A contact hole 108 is formed in the first interlayer insulating layer 106 using photolithography. A first barrier layer 109 and a first contact plug 110 are formed in the contact hole 108. The first contact plug 110 may be formed of a first metal layer, for example, a tungsten layer.

As illustrated in FIGS. 16 and 17, a second interlayer insulating layer 112 is formed to have a second thickness "h2" on the first contact plug 110 and the first interlayer insulating layer 106, wherein the second thickness "h2" corresponds to the rest of the thickness "h" of the interlayer insulating layer 113. Next, a via hole 114 exposing the first contact plug 110 thereon is formed in the second interlayer insulating layer 112 by using photolithography. Next, as described above, the second contact plug 118 is formed using a single damascene process.

Thus, a local wiring layer 119 is formed, wherein the local wiring layer 119 includes the first contact plug 110 and the second contact plug 118 connected to the first contact plug 110. The second contact plug 118 is formed of a second metal layer, for example, a tungsten, copper or rhodium layer. When the second metal layer is a copper layer, the second metal layer may be formed using electroplating. When the second metal layer is a rhodium layer, electroplating may not be used.

In addition, a wiring insulating layer 120 is formed on the second contact plug 118 and the second interlayer insulating layer 112. Next, as described above, a second barrier layer 124 and the wiring layer 126 are formed in a trench 122 by using a single damascene process. The wiring layer 126 may be formed of a third metal layer, for example, a tungsten, copper or rhodium layer. When the third metal layer is a copper layer, the third metal layer may be formed using electroplating. When the third metal layer is a rhodium layer, electroplating may not be used.

According to the above exemplary embodiments of the present invention, a contact hole having a low aspect ratio can be formed by etching a first interlayer insulating layer that is thinner than an entire interlayer insulating layer, thereby reducing the possible difficulties associated with etching the first interlayer insulating layer during manufacturing of a semiconductor device. In addition, a metal layer for a first contact plug can be filled in a contact hole that is formed in the first interlayer insulating layer having a small thickness, thereby preventing filling errors in the metal layer for the first contact plug.

Moreover, a contact plug is divided into a first contact plug and a second contact plug. The second contact plug and a wiring layer are each formed using a single damascene process. The second contact plug and the wiring layer are formed using a dual damascene process. Thus, due to the conductive patterns, for example, the gate patterns adjacent to the first contact plug, short circuits can be prevented between the wiring layer and the conductive patterns or between the gate patterns, and the first contact plug can be formed correctly on the gate patterns or a support layer.

In addition, as a first contact plug formed in a first interlayer insulating layer is formed of tungsten, and a second contact plug formed in a second interlayer insulating layer is formed of copper or rhodium, the contact resistance is significantly reduced compared to the case where a contact hole is filled with tungsten so as to form a contact plug.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of forming a wiring layer of a semiconductor device, the method comprising:
    forming a first interlayer insulating layer to have a first thickness that corresponds to a part of the thickness of an interlayer insulating layer that is to be formed on a support layer;
    forming a first contact plug in the first interlayer insulating layer;
    forming a second interlayer insulating layer to have a second thickness on the first contact plug and the first interlayer insulating layer, thereby foaming the interlayer insulating layer, wherein the second thickness corresponds to the rest of the thickness of the interlayer insulating layer, and wherein the first thickness of the first interlayer insulating layer is half or less than half of the thickness of the interlayer insulating layer; and
    forming a second contact plug connected to the first contact plug in the second interlayer insulating layer, thereby forming a local wiring layer including the first contact plug and the second contact plug.

2. The method of claim 1, wherein the support layer is one of a silicon substrate or a polysilicon layer doped with impurities.

3. The method of claim 1, wherein the support layer is a silicon substrate, and the method further comprises:
    forming a plurality of gate patterns on the silicon substrate; and
    forming the first contact plug so as to contact the silicon substrate between the gate patterns.

4. The method of claim 3, wherein the first thickness is greater than the thickness of each of the gate patterns.

5. The method of claim 1, wherein the support layer is a silicon substrate, and the method further comprises:
    forming a plurality of gate patterns on the silicon substrate: and
    forming an etch-stop layer covering the gate patterns.

6. The method of claim 1, wherein the support layer is a silicon substrate, and method further comprises:
    forming a plurality of gate patterns on the silicon substrate: and
    forming the first contact plug so as to contact both an upper portion of each of the gate patterns and the silicon substrate between the gate patterns.

7. The method of claim 1, wherein the forming of the first contact plug comprises:
    forming a contact hole exposing the support layer in the first interlayer insulating layer; and filling the contact hole with a first metal layer and planarizing the first metal layer, and the forming of the second contact plug comprises:
    forming a via hole exposing the first contact hole in the second interlayer insulating layer; and filling the via hole with a second metal layer and planarizing the second metal layer, by using a single damascene process.

8. The method of claim 1, further comprising:
    forming a wiring insulating layer on the second contact plug and the second interlayer insulating layer; and
    forming a wiring layer connected to the second contact plug in the wiring insulating layer.

9. The method of claim 8, wherein the forming of the wiring layer comprises: forming a trench exposing the second contact plug in the wiring insulating layer; and filling the trench with a third metal and planarizing the third metal layer, by using a single damascene process.

10. The method of claim 8, further comprising:
forming an exposure hole exposing the first contact plug thereon in the wiring insulating layer and the second interlayer insulating layer; and
filing a metal layer in the exposure hole by using a dual damascene process, thereby forming a local wiring layer including the first contact plug and the second contact plug connected to the first contact plug and simultaneously forming a wiring layer connected to the second contact plug.

11. The method of claim 1, wherein the forming of the first contact plug comprises: forming a contact hole exposing the support layer in the first interlayer insulating layer; forming an additional insulating layer on an inner barrier of the contact hole so as to reduce the diameter of the contact hole; and filling a metal layer in the contact hole in which the additional insulating layer is formed.

12. A method of forming a wiring layer of a semiconductor device, the method comprising:
forming a first interlayer insulating layer to have a first thickness corresponding to a part of the thickness of an interlayer insulating layer that is to be formed on a support layer;
forming a first contact plug comprising a tungsten layer in the first interlayer insulating layer;
forming a second interlayer insulating layer to have a second thickness on the first contact plug and the first interlayer insulating layer, wherein the second thickness corresponds to the rest of the thickness of the interlayer insulating layer, and wherein the first thickness of the first interlayer insulating layer is half or less than half of the thickness of the interlayer insulating layer;
forming a second contact plug comprising one of a copper layer or a rhodium layer connected to the first contact plug in the second interlayer insulating layer by using a single damascene process, thereby forming a local wiring layer including the first contact plug and the second contact plug;
forming a wiring insulating layer on the second contact plug and the second interlayer insulating layer; and
forming a wiring layer connected to the second contact plug in the wiring insulating layer by using a single damascene process.

13. The method of claim 12, wherein the forming of the first contact plug comprises: forming a contact hole exposing the support layer in the first interlayer insulating layer; and filling a first metal layer in the contact hole and planarizing the first metal layer, the forming of the second contact plug comprises:
forming a via hole exposing the first contact plug thereon in the second interlayer insulating layer; and filling a second metal layer in the via hole and planarizing the second metal layer, by using a single damascene process, and the forming of the wiring layer comprises: forming a trench exposing the second contact plug thereon in the wiring insulating layer; and
filling a third metal layer in the trench and planarizing the third metal layer, by using a single damascene process.

14. The method of claim 13, wherein the support layer is a silicon substrate, further comprising:
forming a plurality of gate patterns on the silicon substrate: and
forming an etch-stop layer covering the gate patterns.

15. The method of claim 13, wherein the support layer is a silicon substrate, further comprising:
forming a plurality of gate patterns on the silicon substrate: and
forming the first contact plug so as to contact both an upper portion of each of the gate patterns and the silicon substrate between the gate patterns.

16. A method of forming a wiring layer of a semiconductor device, the method comprising:
forming a first interlayer insulating layer to have a first thickness corresponding to a part of the thickness of an interlayer insulating layer that is to be formed on a support layer;
forming a first contact plug comprising a tungsten layer in the first interlayer insulating layer;
forming a second interlayer insulating layer to have a second thickness on the first contact plug and the first interlayer insulating layer, wherein the second thickness corresponds to the rest of the thickness of the interlayer insulating layer, thereby forming the interlayer insulating layer and wherein the first thickness of the first interlayer insulating layer is half or less than half of the thickness of the interlayer insulating layer;
forming a wiring insulating layer on the second interlayer insulating layer;
forming an exposure hole exposing the first contact plug in the wiring insulating layer and the second interlayer insulating layer; and
filling a metal layer in the exposure hole by using a dual damascene process, thereby forming a local wiring layer including the first contact plug formed of the tungsten layer and a second contact plug comprised of one of a copper layer or a rhodium layer connected to the first contact plug and simultaneously forming a wiring layer connected to the second contact plug.

17. The method of claim 16, wherein the forming of the first contact plug comprises: forming a contact hole exposing the support layer in the first interlayer insulating layer; and filling the contact hole with a first metal layer and planarizing the first metal layer, and the forming of the second contact plug and the wiring layer comprises: forming a trench in the wiring insulating layer; forming the exposure hole by forming a via hole exposing the first contact plug in the second interlayer insulating layer below the trench; and filling a second metal layer in the exposure hole and planarizing the second metal layer, using a dual damascene process.

18. The method of claim 17, further comprising: after forming of the contact hole, foaming an additional insulating layer on an inner barrier of the contact hole so as to reduce the diameter of the contact hole.

19. The method of claim 16, wherein the support layer is a silicon substrate, further comprising:
forming a plurality of gate patterns on the silicon substrate;
forming an etch-stop layer covering the gate patterns; and
forming the first contact plug so as to contact the silicon substrate between the gate patterns.

20. The method of claim 1, wherein the first contact plug comprises a tungsten layer and the second contact plug comprises one of a copper layer or a rhodium layer.

* * * * *